US009613791B2

(12) United States Patent
Uehara et al.

(10) Patent No.: US 9,613,791 B2
(45) Date of Patent: Apr. 4, 2017

(54) CALCIUM FLUORIDE OPTICAL MEMBER, MANUFACTURING METHOD THEREFOR, GAS-HOLDING CONTAINER, AND LIGHT SOURCE DEVICE

(71) Applicant: NIKON CORPORATION, Tokyo (JP)

(72) Inventors: Naoyasu Uehara, Sagamihara (JP); Motofusa Kageyama, Fujisawa (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/245,716

(22) Filed: Aug. 24, 2016

(65) Prior Publication Data

US 2016/0365237 A1    Dec. 15, 2016

Related U.S. Application Data

(63) Continuation of application No. PCT/JP2015/055925, filed on Feb. 27, 2015.

(30) Foreign Application Priority Data

Feb. 28, 2014  (JP) ................ 2014-037979

(51) Int. Cl.
| H01J 61/30 | (2006.01) |
| H01J 61/62 | (2006.01) |
| H01J 63/08 | (2006.01) |
| C01F 11/22 | (2006.01) |
| C30B 29/12 | (2006.01) |
| C30B 29/66 | (2006.01) |
| B65D 51/24 | (2006.01) |

(52) U.S. Cl.
CPC ......... *H01J 61/302* (2013.01); *B65D 51/248* (2013.01); *C01F 11/22* (2013.01); *C30B 29/12* (2013.01); *C30B 29/66* (2013.01)

(58) Field of Classification Search
CPC .................................................. H01J 61/302
See application file for complete search history.

(56) References Cited

U.S. PATENT DOCUMENTS

| 2009/0058299 A1* | 3/2009 | Oda ............... H01J 61/125 313/607 |
| 2011/0158281 A1* | 6/2011 | Nagai ............. G02B 1/02 372/61 |
| 2013/0342105 A1* | 12/2013 | Shchemelinin ... H01J 37/32055 315/111.21 |
| 2015/0034838 A1* | 2/2015 | Bezel ................ H01J 65/04 250/432 R |

FOREIGN PATENT DOCUMENTS

| JP | 2006-327837 | 12/2006 |
| JP | 2009-163965 | 7/2009 |
| JP | 4569872 | 10/2010 |

OTHER PUBLICATIONS

International Search Report mailed Jun. 2, 2015, in corresponding International Application No. PCT/JP2015/055925.
International Written Opinion dated Jun. 2, 2015 in corresponding International Patent Application No. PCT/JP2015/055925.

* cited by examiner

*Primary Examiner* — Mariceli Santiago

(57) ABSTRACT

There is provided a calcium fluoride optical member formed from monocrystalline calcium fluoride and having a tubular shape. A {110} crystal plane or a {111} crystal plane of the monocrystalline calcium fluoride is orthogonal to a center axis of the tube.

26 Claims, 8 Drawing Sheets

| TEMPERATURE | ELASTIC STIFFNESS [GPa] | | |
| --- | --- | --- | --- |
| [°C] | $C_{11}$ | $C_{12}$ | $C_{44}$ |
| 25 | 164 | 43.7 | 34.6 |
| 100 | 159 | 41.3 | 34.2 |
| 120 | 159 | 40.9 | 34.1 |
| 150 | 157 | 40.2 | 34.0 |
| 200 | 155 | 39.6 | 33.8 |
| 250 | 153 | 39.0 | 33.2 |
| 500 | 141 | 34.7 | 31.0 |
| 1000 | 104 | 18.4 | 26.0 |

FIG. 4

| ANALYSIS | ANALYSIS CONDITIONS | | MAXIMUM SHEAR STRESS IN {100} PLANE [MPa] | | | | | |
|---|---|---|---|---|---|---|---|---|
| | | | 30 atm | | | | 20 atm | 10 atm |
| EXAMPLE | CRYSTAL PLANE ARRANGEMENT | MATERIAL PROPERTIES [°C] | MAXIMUM VALUE | (001) PLANE | (100) PLANE | (010) PLANE | MAXIMUM VALUE | MAXIMUM VALUE |
| 1 | {100} PLANE | 25 | 9.21 | 9.21 | 0.01 | 0.01 | 6.14 | 3.07 |
| 2 | {100} PLANE | 100 | 9.21 | 9.21 | 0.01 | 0.01 | 6.14 | 3.07 |
| 3 | {100} PLANE | 200 | 9.21 | 9.21 | 0.01 | 0.01 | 6.14 | 3.07 |
| 4 | {110} PLANE | 25 | 7.67 | 6.92 | 7.67 | 6.92 | 5.11 | 2.56 |
| 5 | {110} PLANE | 100 | 7.66 | 6.93 | 7.66 | 6.93 | 5.11 | 2.55 |
| 6 | {110} PLANE | 200 | 7.67 | 6.92 | 7.67 | 6.92 | 5.11 | 2.56 |
| 7 | {111} PLANE | 25 | 7.80 | 5.70 | 7.17 | 7.80 | 5.20 | 2.60 |
| 8 | {111} PLANE | 100 | 7.80 | 5.70 | 7.18 | 7.80 | 5.20 | 2.60 |
| 9 | {111} PLANE | 200 | 7.79 | 5.69 | 7.19 | 7.79 | 5.19 | 2.60 |

FIG. 5

CALCIUM FLUORIDE OPTICAL MEMBER, MANUFACTURING METHOD THEREFOR, GAS-HOLDING CONTAINER, AND LIGHT SOURCE DEVICE

CROSS-REFERENCE TO RELATED APPLICATIONS

This application is a Continuation Application of International Application No. PCT/JP2015/055925 claiming the conventional priority of Japanese patent Application No. 2014-037979 filed on Feb. 28, 2014 and titled "CALCIUM FLUORIDE OPTICAL MEMBER, MANUFACTURING METHOD THEREFOR, GAS-HOLDING CONTAINER, AND LIGHT SOURCE DEVICE". The disclosures of Japanese patent Application No. 2014-037979 and International Application No. PCT/JP 015/055925 are incorporated herein by reference in their entirety.

BACKGROUND

The present disclosure relates to a calcium fluoride optical member, a manufacturing method therefor, a gas-holding container, and alight source device, and particularly relates to a monocrystalline calcium fluoride optical member, a manufacturing method therefor, and a gas-holding container and light source device including the monocrystalline calcium fluoride optical member.

Monocrystalline calcium fluoride ($CaF_2$, fluorite) exhibits high transmittance with respect to light having a wide range of wavelengths, ranging from the vacuum ultraviolet region to the infrared region. Therefore, monocrystalline $CaF_2$ is widely used as various types of optical members, such as the arc tubes of excimer lamps (Japanese Unexamined Patent Application Publication No. 2009-163965A).

SUMMARY

Optical members formed from monocrystalline $CaF_2$ are used in a variety of environments having different temperatures, pressures, and the like, but are known to have insufficient strength in high-temperature and high-pressure environments. As a consequence, an optical member formed from monocrystalline $CaF_2$ may not be suitable depending on, for example, the application of the optical member, or the environment.

In light of the foregoing, an object of the present disclosure is to solve the above problem, that is, to provide a monocrystalline $CaF_2$ optical member that can be reliably used even at high temperatures and under high pressures, and a manufacturing method for the monocrystalline $CaF_2$ optical member.

A first aspect of the present disclosure provides a calcium fluoride optical member formed from monocrystalline calcium fluoride and having a tubular shape. In such a member, a {110} crystal plane or a {111} crystal plane of the monocrystalline calcium fluoride is orthogonal to a center axis of the tube.

A second aspect of the present disclosure provides a manufacturing method of a calcium fluoride optical member, the method including:
specifying a direction of a {1101} crystal plane or a {111} crystal plane of monocrystalline calcium fluoride; and machining the monocrystalline calcium fluoride into a tubular shape. In such a method, the machining is carried out so that a center axis of the tube and the specified direction of the {110} crystal plane or the {111} crystal plane are orthogonal to each other.

A third aspect of the present disclosure provides a calcium fluoride member formed from monocrystalline calcium fluoride and having a tubular shape. In such a member, an angle at which one of a {110} crystal plane and a {111} crystal plane of the monocrystalline calcium fluoride intersects with a direction in which the tube extends is in a range of 90°±5°.

A fourth aspect of the present disclosure provides a calcium fluoride member formed from monocrystalline calcium fluoride and having a tubular shape. In such a member, a {110} crystal plane or a {111} crystal plane of the monocrystalline calcium fluoride and a direction in which the tube extends intersect at an angle of approximately 90°.

BRIEF DESCRIPTION OF DRAWINGS

FIG. 4 shows values of an elastic stiffness used in a simulation.

FIG. 5 shows analysis conditions and analysis results for each of analysis examples.

EMBODIMENTS

Embodiment 1

Embodiment 1 of the present disclosure will be described with reference to FIGS. 1 to 6.

Figure 1:
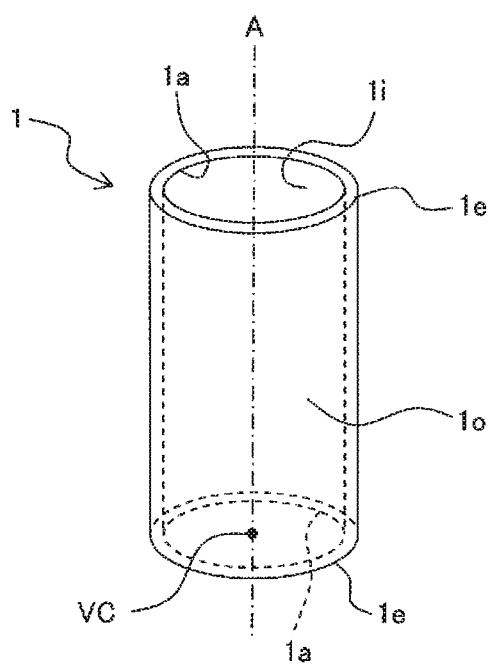
FIG. 1 is a perspective view of an optical member according to an embodiment of the present disclosure.

As illustrated in FIG. 1, an optical member 1 according to the present embodiment is a cylindrical $CaF_2$ tube having a center axis (rotation axis) A. The optical member 1 is formed from monocrystalline $CaF_2$, and a {110} crystal plane or a {111} crystal plane of the monocrystalline $CaF_2$ is present in a direction orthogonal to the center axis A. An outer surface 1o, an inner surface 1i, and end surfaces 1e of the optical member 1 are optically polished. The {110} crystal plane, the {111} crystal plane, and the like will be denoted simply as a {110} plane, a {111} plane, and the like hereinafter.

Note that in the present specification. "monocrystalline $CaF_2$" refers not only to a literal single crystal (that is a single crystal consists of only one crystal), but also to $CaF_2$ crystals that include two or more $CaF_2$ crystals (but, not as much as uncountable number) and that have substantially the same optical characteristics as the monocrystalline $CaF_2$. Additionally, in the present specification, a "plane orthogonal to an axis (center axis; rotation axis)" and a "plane present so as to be orthogonal to an axis (center axis; rotation axis)" refers not only to a plane orthogonal to (intersecting at an angle of 90° with) the axis (an "orthogonal plane"), but also to a plane obtained by rotating the orthogonal plane by an angle of approximately 5° or less in any rotation direction around any axis that is within the orthogonal plane and intersects with the above-described axis (a plane intersecting with the axis at an angle of 90°±5°).

The optical member 1 can be used in a variety of fields. In the semiconductor manufacturing equipment industry, for example, the optical member 1 can be used in alight source for an exposure device or in alight source for a wafer inspection device or the like. In this case, for example, the optical member 1 is filled with a gas from at least one of openings 1a formed in both end surfaces 1e of the optical member 1, and then caps (not illustrated) are attached to the openings I a on both end surfaces 1e in order to seal (trap) the gas inside the optical member 1. The optical member 1 in which the gas has been sealed therein is then held in place by any type of holding member (not illustrated). The gas sealed in this state is then irradiated with excitation light such as infrared light to excite the gas atoms (gas molecules) to a plasma state. The resulting plasma light can then be emitted to outside of the optical member 1 through the inner surface 1i and the outer surface 1o.

The inventor of the present disclosure found that the strength of the cylindrical optical member 1 relative to the pressure of the gas contained therein (internal pressure), or in other words, the pressure resistance or durability, depends on the arrangement of the crystal planes of the monocrystalline $CaF_2$ from which the optical member 1 is formed. The inventor thus used the simulations described below (finite element analyses to identify the crystal plane arrangement capable of increasing the strength relative to the internal pressure of the optical member 1 to the greatest degree.

Analysis Object

The object of analysis in the simulations is the cylindrical optical member 1 illustrated in FIG 1. In the simulations, the dimensions of the optical member 1 were set as follows: an outer diameter of 30 mm; an inner diameter of 25 mm; and a length in the center axis A direction of 50 mm. Additionally, in the simulations, it was assumed that the optical member 1 is formed from monocrystalline $CaF_2$ in a narrow sense consisting of a single crystal.

Analysis Conditions

In the simulations, the maximum value of shear stress arising in $\{100\}$ plane of the monocrystalline $CaF_2$ from which the optical member 1 is formed when an internal pressure is produced within the optical member 1 was analyzed, using the optical member 1 having the above-described dimensions. First, descriptions will be given of analysis conditions in nine analysis examples (Analysis Examples 1 to 9) in which analysis was carried out through the simulations.

The following analysis conditions are the same for a of the analysis examples.

(1) Position Constraint Conditions

Figure 2:
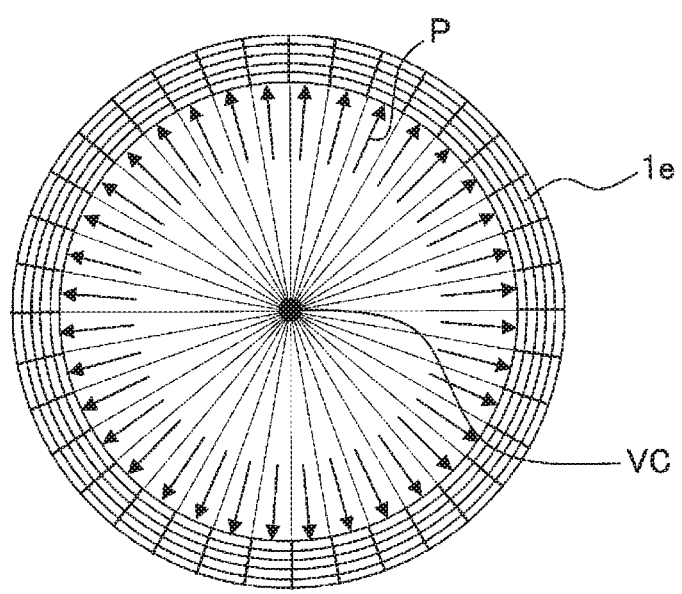
FIG. 2 is a schematic diagram illustrating position constraint conditions and load conditions in a simulation.
Figure 3:
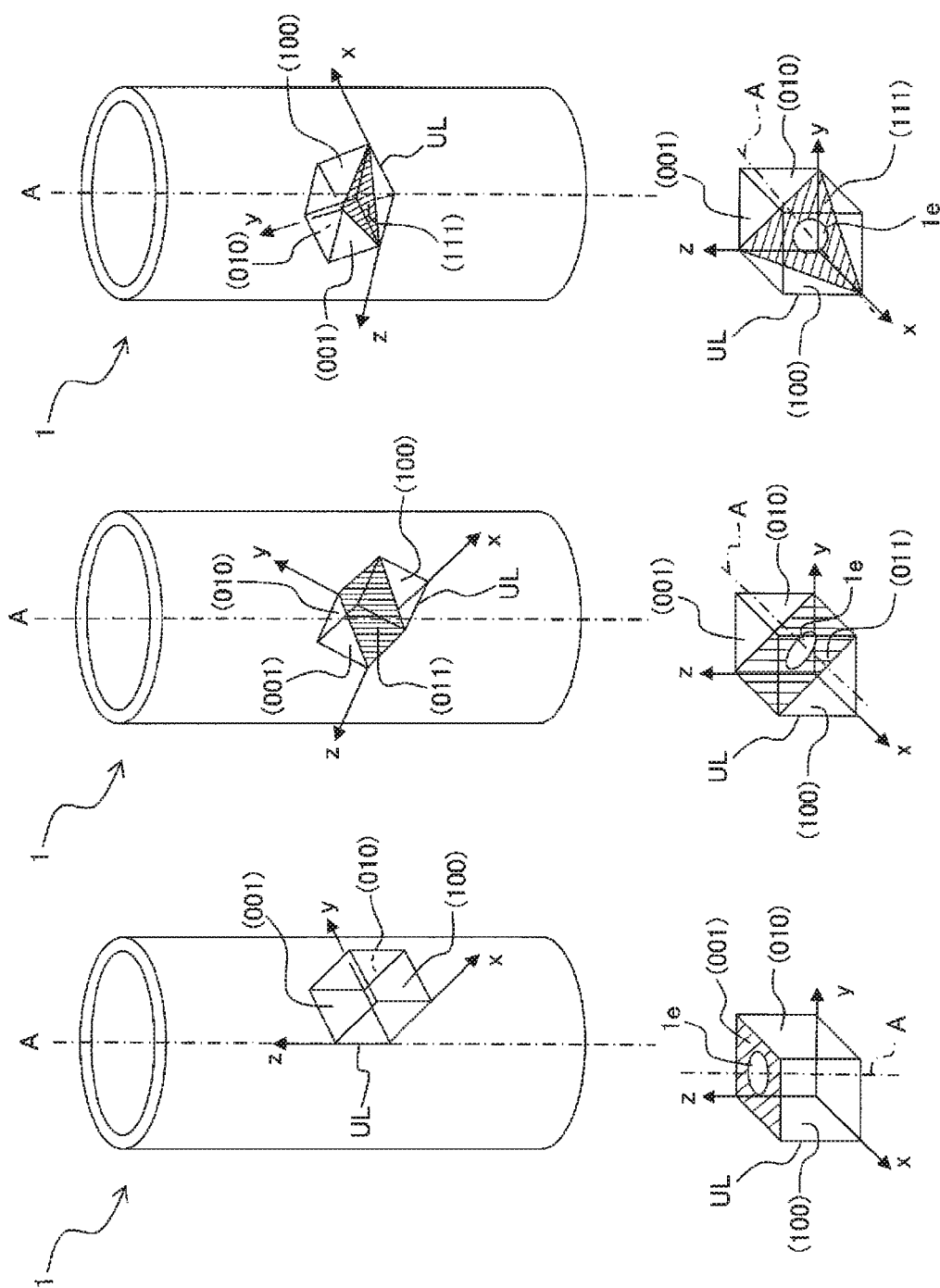
FIGS. 3A to 3C illustrate positional relationships between an optical member and a unit lattice (cubic lattice) of monocrystalline $CaF_2$, and positional relationships between the optical member and a principal axis x, a principal axis y, and a principal axis z of the unit lattice.

In all of Analysis Examples 1 to 9, a virtual constraint point VC was set at a point of intersection between a plane including the end surface 1e of the optical member 1 and the center axis A, as indicated in FIGS. 1 and 2. By constraining the position of this virtual constraint point VC, the optical member 1 was fully constrained to the virtual constraint point. This constrained the optical member 1 in a fixed state, where the shape of the optical member 1 could freely deform in response to aloud without any restrictions but in which the overall position of the optical member 1 did not shift under the load.

(2) Load Conditions

In all of Analysis Examples 1 to 9, the interior of the optical member 1 was set to 30 atm. This ensured that a pressure P in radial directions (FIG. 2) acted on the optical member 1 uniformly in the circumferential direction thereof.

The following analysis conditions were different depending on the analysis examples.

(3) Crystal Plane Arrangement

In the analysis, optical members 1 having the following three types of crystal plane arrangements were used as analysis objects.

Arrangement I: the $\{100\}$ plane of the monocrystalline $CaF_2$ was present in a direction orthogonal to the center axis A of the optical member 1 (Analysis Examples 1 to 3; FIG. 3A).

Arrangement II: the $\{110\}$ plane of the monocrystalline $CaF_2$ was present in the direction orthogonal to the center axis A of the optical member 1 (Analysis Examples 4 to 6; FIG. 3B).

Arrangement III the $\{111\}$ plane of the monocrystalline $CaF_2$ was present in the direction orthogonal to the center axis A of the optical member 1 (Analysis Examples 7 to 9; FIG. 3C).

Arrangements I to III will be described in detail with reference to FIGS. 3A to 3C. The upper parts of FIGS. 3A to 3C illustrate the arrangements of a unit lattice (cubic lattice) UL of the monocrystalline $CaF_2$ relative to the optical member 1 and the arrangements of a principal axis x, a principal axis y, and a principal axis z of the unit lattice UL relative to the optical member 1, using the optical member 1 as a reference, whereas the lower parts illustrate the arrangement of the optical member 1 relative to the unit lattice UL of the monocrystalline $CaF_2$, using the unit lattice UL as a reference. The upper and lower parts of each drawing correspond to each other, and relationships between the direction of the center axis A of the optical member 1 and the directions of the principal axis x, the principal axis y, and the principal axis z of the unit lattice UL are the same between the upper and lower parts in each of FIGS. 3A to 3C. For the sake of simplicity, the center axis A of the optical member 1 is depicted as passing through the origins of the principal axes x, y, and z in the upper parts of FIGS. 3A to 3C. In the lower parts of these drawings, the arrangement of the optical member 1 is expressed only by the center axis A of the optical member 1 and a contour of the end surface le.

In Arrangement I, a (001) plane, which is a kind of $\{100\}$ plane of the monocrystalline $CaF_2$, is present in a direction orthogonal to the center axis A of the optical member 1, as illustrated in FIG. 3A. Here, the principal axis z of the unit lattice UL matches the center axis A of the optical member 1. The principal axis x and the principal axis y are present in a plane orthogonal to the center axis A.

In Arrangement II, a (011) plane, which is a kind of $\{110\}$ plane of the monocrystalline $CaF_2$, is present in a direction orthogonal to the center axis A of the optical member 1, as illustrated in FIG. 3B. Note that the unit lattice UL illustrated in FIG. 3B corresponds to the unit lattice UL illustrated in FIG. 3A being arranged in a position rotated 45° around the principal axis x from a forward direction of the principal axis y toward a forward direction of the principal axis z. In other words, in FIG. 3B, the principal axis x of the unit lattice UL is present in a plane orthogonal to the center axis A, and the principal axes y and z of the unit lattice UL are each tilted 45° relative to the center axis A of the optical member 1 in a plane defined by the principal axis y and the principal axis z.

In Arrangement III, a (111) plane, which is a kind of {111} plane of the monocrystalline CaF$_2$, is present in a direction orthogonal to the center axis A of the optical member 1, as illustrated in FIG. 3C. The arrangement of the unit lattice UL illustrated in FIG. 3C is obtained by first rotating the unit lattice UL illustrated in FIG. 3A 54.7359° around the principal axis x from the forward direction of the principal axis y toward the forward direction of the principal axis z, and then rotating the unit lattice UL 45° around the principal axis z from the forward direction of the principal axis x toward the forward direction of the principal axis y. As such, none of the principal axes x, y, and z of the unit lattice UL in FIG. 3C are in a plane orthogonal to the center axis A of the optical member 1, and each is tilted relative to the center axis A by a predetermined angle.

(4) Material Properties

In the analysis, optical members 1 having the following three types of material properties were used as analysis objects.

Material Properties I: an optical member 1 formed from a material having orthotropic anisotropy and having a temperature of 25° C. (Analysis Examples 1, 4, and 7).

Material Properties II: an optical member 1 formed from a material having orthotropic anisotropy and having a temperature of 100° C. (Analysis Examples 2, 5, and 8).

Material Properties III: an optical member 1 formed from a material having orthotropic anisotropy and having a temperature of 200° C. (Analysis Examples 3, 6, and 9), Material Properties I to III are the same in terms of the fact that the optical member 1 has orthotropic anisotropy. This is because monocrystalline CaF$_2$ is a material having orthotropic anisotropy. Monocrystailine CaF$_2$ is a cubic monocrystalline hod; thus, an elastic matrix in the constitutive formula used in the analysis is the following Formula 1 for each of Material Properties I to III:

$$\begin{bmatrix} C_{11} & C_{12} & C_{12} & 0 & 0 & 0 \\ & C_{11} & C_{12} & 0 & 0 & 0 \\ & & C_{11} & 0 & 0 & 0 \\ & & & C_{44} & 0 & 0 \\ & sym & & & C_{44} & 0 \\ & & & & & C_{44} \end{bmatrix} \quad \text{Formula 1}$$

where, $C_{11}$, $C_{12}$, and $C_{44}$ each represent an elastic stiffness [GPa].

On the other hand, the respective values of the elastic stiffnesses in Formula 1 vary depending on the temperature; in other words, these values are different depending on Material Properties I to III. The values of the elastic stiffnesses $C_{11}$, $C_{12}$, and $C_{44}$ used in the analyses are indicated in FIG. 4. These values are calculated using measurement values obtained by measuring the sonic velocity [m/s] of an ultrasonic wave propagating within the monocrystalline CaF$_2$ on the basis of "dynamic elastic modulus testing method-ultrasonic pulse method" of "Testing Methods for Elastic Modulus of Fine Ceramics" defined in MS R 1602. In a case where the analysis is carried out under the conditions according to Material Properties I, the elastic stiffnesses $C_{11}$, $C_{12}$, and $C_{44}$ shown in the 25°C. row of FIG. 4 are substituted into Formula 1. Likewise, in a case where the analyses under the conditions according to Material Properties II and III, the elastic stiffnesses $C_{11}$, $C_{12}$, and $C_{44}$ shown in the 100° C. and 200° C. rows of FIG. 4 are substituted into Formula 1.

Analysis Examples 1 to 9 obtained by combining the conditions described above, or in other words the position constraint conditions, the load conditions, the crystal plane arrangements, and the material properties, are organized in the table of FIG. 5. As described above, the position constraint conditions and the load conditions are the same in all of the analysis examples and thus are not shown in the "analysis conditions" section of the table of FIG. 5. The crystal plane arrangements are as follows: in Analysis Examples 1 to 3, Arrangement I, in which the {100} plane is orthogonal to the center axis A of the optical member 1; in Analysis Examples 4 to 6, Arrangement II, in which the {110} plane is orthogonal to the center axis A of the optical member 1; and in Analysis Examples 7 to 9. Arrangement III, in which the {111} plane is orthogonal to the center axis A of the optical member 1. The material properties are as follows: in Analysis Examples 1, 4, and 7, the temperature of the optical member 1 is 25° C.; in Analysis Examples 2, 5, and 8, the temperature of the optical member 1 is 100° C.; and in Analysis Examples 3, 6, and 9, the temperature of the optical member 1 is 200° C.

Results of simulations carried out under the above-described conditions will be described next. The inventor of the present invention estimated a maximum shear stress produced in the three {100} planes, or in other words, a (100) plane, a (010) plane, and the (001) plane, of the monocrystalline CaF$_2$ that forms the optical member 1, under the above-described analysis conditions.

Analysis Examples 1 to 3

In Analysis Examples 1 to 3, analysis was carried out on an optical member 1 in which the {100} plane, and more specifically the (001) plane, of the monocrystalline CaF$_2$ that forms the optical member 1 was orthogonal to the center axis A of the optical member 1 (FIG. 3A). The values of the maximum shear stress [MPa] produced in the (100) plane, the (010) plane, and the (001) plane of the monocrystalline CaF$_2$ obtained from this analysis were as shown in the table of FIG. 5. Note that as illustrated in FIG. 3A, the (100) plane in Analysis Examples 1 to 3 was present parallel to a plane defined by the principal axis y and the principal axis z (called a "yz plane" hereinafter for brevity) in a state where the principal axis z of the unit lattice UL matches the center axis A of the optical member 1. Likewise, the (010) plane was present parallel to a plane defined by the principal axis x and the principal axis z (called an "xz plane" hereinafter for brevity) in the same state.

As shown in the table of FIG. 5, a maximum shear stress of 0.01 MPa was produced in the (100) plane, a maximum shear stress of 0,01 MPa was produced in the (010) plane, and a maximum shear stress of 9.21 MPa was produced in the (001) plane regardless of whether the material properties were 25° C. (Analysis Example 1), 100° C. (Analysis Example 2), or 200° C. (Analysis Example 3), As such, the maximum shear stress produced in the {100} plane had the highest value in the (001) plane, at a value of 9.21 MPa (the "maximum value" column in the table of FIG. 5), in all of Analysis Examples 1 to 3.

The table of FIG. 5 further shows analysis values of the maximum shear stress produced in the {100} plane in a case where the load conditions were reduced from an internal pressure of 30 atm to 20 atm and 10 atm without changing the other conditions. The value of the maximum shear stress produced in the {100} plane when the internal pressure was 20 atm was 6.14 MPa in the (001) plane, and the value of the maximum shear stress produced in the {100} plane when the internal pressure was 10 atm was 3.07 MPa in the (001) plane, regardless of whether the material properties were 25° C. (Analysis Example 1), 100° C. (Analysis Example 2), or 200° C. (Analysis Example 3). The position where the maximum shear stress was produced under the above-described conditions was on the inner surface 1i of the optical member 1.

Analysis Examples 4 to 6

In Analysis Examples 4 to 6, analysis was carried out on an optical member 1 in which the {110} plane, and more specifically the (011) plane, of the monocrystalline $CaF_2$ that forms the optical member 1 was orthogonal to the center axis A of the optical member 1 (FIG. 3B). The values of the maximum shear stress [MPa] produced in the (100) plane, the (010) plane, and the (001) plane of the monocrystalline $CaF_2$ obtained from this analysis were as shown in the table of FIG. 5. As illustrated in FIG. 3B, the (100) plane in Analysis Examples 4 to 6 was present parallel to the yz plane in a state where the principal axis x of the unit lattice UL is present in a plane orthogonal to the center axis A of the optical member 1 and the principal axis y and principal axis z are each present in the yz plane at an angle of 45° relative to the center axis A. Likewise, the (010) plane was present parallel to the xz plane in the same state, and the (001) plane was present parallel to a plane defined by the principal axis x and the principal axis y (called an "xy plane" hereinafter for brevity) in the same state.

As shown in FIG. 5, when the material properties were 25° C. (Analysis Example 4), the maximum shear stress produced in the (100) plane was 7.67 MPa, the maximum shear stress produced in the (010) plane was 6.92 MPa, and the maximum shear stress produced in the (001) plane was 6.92 MPa. Thus when the material properties were 25° C., the maximum shear stress produced in the {100} plane was the 7.67 MPa produced in the (100) plane (shown in the "maximum value" column in the table of FIG. 5).

When the material properties were 100° C. (Analysis Example 5), the maximum shear stress produced in the (100) plane was 7.66 MPa, the maximum shear stress produced in the (010) plane was 6.93 MPa, and the maximum shear stress produced in the (001) plane was 6.93 MPa. Thus when the material properties were 100° C. the maximum shear stress produced in the {100} plane was the 7.66 MPa produced in the (100) plane (shown in the "maximum value" column in the table of FIG. 5). Likewise, when the material properties were 200°C. (Analysis Example 6), the maximum shear stress produced in the (100) plane was 7.67 MPa, the maximum shear stress produced in the (010) plane was 6.92 MPa, and the maximum shear stress produced in the (001) plane was 6.92 MPa. Thus when the material properties were 200° C., the maximum shear stress produced in the {100} plane was the 7.67 MPa produced in the (100) plane (shown in the "maximum value" column in the table of FIG. 5).

The table of FIG. 5 further shows analysis values of the maximum shear stress produced in the {100} plane in the case where the load conditions were reduced from an internal pressure of 30 atm to 20 atm and 10 atm without changing the other conditions. The value of the maximum shear stress produced in the {100} plane when the internal pressure 20 atm was 5.11 MPa in the (100) plane, and the value of the maximum shear stress produced in the {100} plane when the internal pressure was 10 atm was approximately 2.56 MPa in the (100) plane, regardless of whether the material properties were 25° C. (Analysis Example 4), 100° C. (Analysis Example 5), or (Analysis Example 6). The position where the maximum shear stress was produced under the above-described conditions was on the inner surface 1i of the optical member 1.

Analysis Examples 7 to 9

In Analysis Examples 7 to 9, analysis was carried out on an optical member 1 in which the {111} plane, and more specifically the (111) plane, of the monocrystalline $CaF_2$ that forms the optical member 1 was orthogonal to the center axis A of the optical member 1 (FIG. 3C). The values of the maximum shear stress [MPa] produced in the (100) plane, the (010) plane, and the (001) plane of the monocrystalline $CaF_2$ obtained from this analysis were as shown in the table of FIG. 5. As illustrated in FIG. 3C, the (100) plane in Analysis Examples 7 to 9 was present parallel to the yz plane in astute where the principal axes x, y, and z of the unit lattice UL are each tilted by a predetermined angle relative to the center axis A of the optical member 1. Likewise, the (010) plane was present parallel to the xz plane in the same state, and the (001) plane was present parallel to the xy plane in the same state.

As shown in the table of FIG. 5, when the material properties were 25° C. (Analysis Example 7), the maximum shear stress produced in the (100) plane was 7.17 MPa, the maximum shear stress produced in the (010) plane was 7.80 MPa, and the maximum shear stress produced in the (001) plane was 5.70 MPa. Thus when the material properties were 25°C., the maximum shear stress produced in the {100} plane was the 7.80 MPa produced in the (010) plane (shown in the "maximum value" column in the table of FIG. 5).

When the material properties were 100° C. (Analysis Example 8), the maximum shear stress produced in the (100) plane was 7.18 MPa, the maximum shear stress produced in the (010) plane was 7.80 MPa, and the maximum shear stress produced in the (001) plane was 5.70 MPa. Thus when the material properties were 100° C. the maximum shear stress produced in the {100} plane was the 7.80 MPa produced in the (010) plane (shown in the "maximum value" column in the table of FIG. 5). Likewise, when the material properties were 200°C (Analysis Example 9), the maximum shear stress produced in the (100) plane was 7.19 MPa, the maximum shear stress produced in the (010) plane was 7.79 MPa, and the maximum shear stress produced in the (001) plane was 5.69 MPa. This when the material properties were 200°C., the maximum shear stress produced in the {100} plane was the 7.79 MPa produced in the (010) plane (shown in the "maximum value" column in the table of FIG. 5).

The table of FIG. 5 further shows analysis values of the maximum shear stress produced in the {100} plane in the case where the load conditions were reduced from an internal pressure of 30 atm to 20 atm and 10 atm without changing the other conditions. The value of the maximum shear stress produced in the {100} plane when the internal pressure was 20 atm was approximately 5.20 MPa in the (010) plane, and the value of the maximum shear stress produced in the {100} plane when the internal pressure was 10 atm was 2.60 MPa in the (010) plane, regardless of whether the material properties were 25° C. (Analysis Example 7), 100° C. (Analysis Example 8), or 200° C. (Analysis Example 9). The position where the maximum shear stress was produced under the above-described conditions was on the inner surface 1i of the optical member 1.

Based on the above simulations, in the case where the internal pressure of the optical member 1 is 30 atm, the maximum shear stress produced in the {100} plane of the monocrystalline $CaF_2$ that forms the optical member 1 is 9.21 MPa in the optical member 1 in which the {100} plane of the monocrystalline $CaF_2$ is orthogonal to the center axis A, under any of the conditions of 25° C. 100° C., and 200°

C. Furthermore, in the case where the internal pressure is reduced to 20 atm and 10 atm, the maximum shear stress produced in the {100} plane of the monocrystalline CaF$_2$ also drops to 6.14 MPa and 3.07 MPa, under any of the conditions of 25° C. 100° C., and 200° C.

Likewise, in the case where the internal pressure of the optical member 1 is 30 atm, the maximum shear stress produced in the {100} plane of the monocrystalline CaF$_2$ that forms the optical member 1 is approximately 7.67 MPa in the optical member 1 in which the {110} plane of the monocrystalline CaF$_2$ is orthogonal to the center axis A, under any of the conditions of 25° C. 100° C., and 200° C. Furthermore, in the case where the internal pressure is reduced to 20 atm and 10 atm, the maximum shear stress produced in the {100} plane of the monocrystalline CaF$_2$ also drops to 5.11 MPa and approximately 2.56 MPa, under any of the conditions of 25° C., 100° C., and 200° C. In the case where the internal pressure of the optical member 1 is 30 atm, the maximum shear stress produced in the {100} plane of the monocrystalline CaF$_2$ that forms the optical member 1 is approximately 7.80 MPa in the optical member 1 in which the {111} plane of the monocrystalline CaF$_2$ is orthogonal to the center axis A, under any of the conditions of 25° C., 100° C., and 200° C. Furthermore, in the case where the internal pressure is reduced to 20 atm and 10 atm, the maximum shear stress produced in the {100} plane of the monocrystalline CaF$_2$ also drops to approximately 5.20 MPa and 2.60 MPa, under any of the conditions of 25° C., 100° C., and 200° C.

Figure 6:
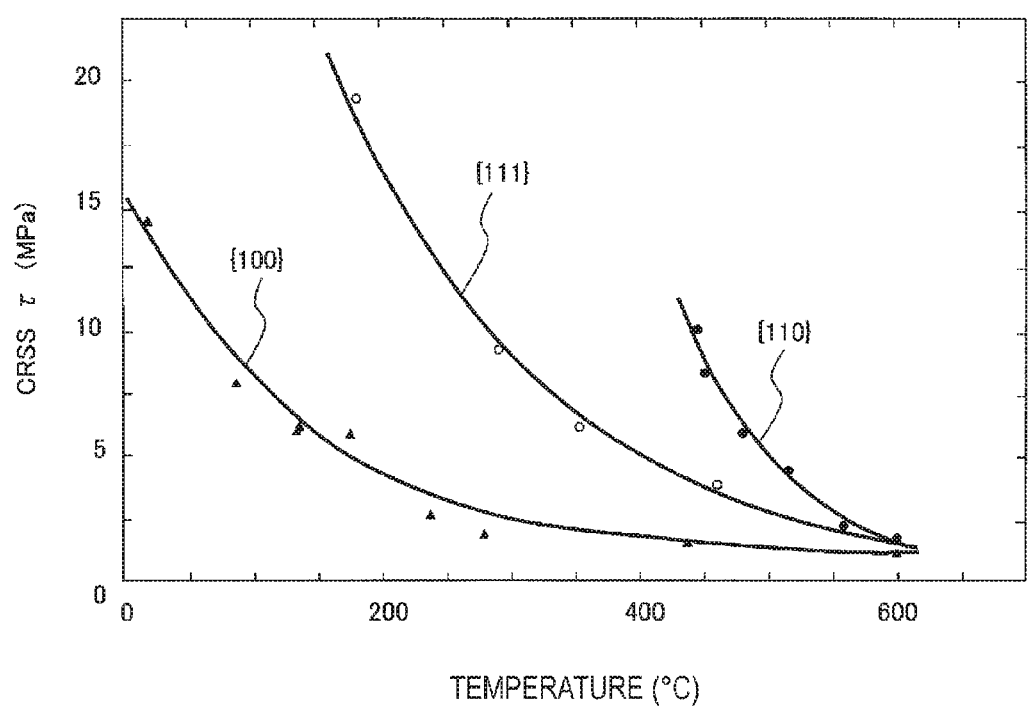
FIG. 6 is a graph showing a relationship between a critical resolved shear stress (CRSS) of monocrystalline $CaF_2$ and temperature of monocrystalline $CaF_2$ for each of crystal planes.

As shown in FIG. 6, the critical resolved shear stress (CRSS) in the {100} plane, the {110} plane, and the {111} plane of the monocrystalline CaF$_2$ has the lowest value in the {100} plane in a temperature range of lower than or equal to approximately 600° C. A difference between the critical resolved shear stress in the {100} plane and the critical resolved shear stress in the {110} plane and the {111} plane is particularly high in a temperature range of lower than or equal to a temperature at which plastic deformation arises in the monocrystalline CaF$_2$ (approximately 250° C.). Accordingly, in a temperature range of lower than or equal to 600° C., and particularly in a temperature range of lower than or equal to 250° C., damage to the optical member 1 formed from monocrystalline CaF$_2$ in the case where stress has been produced in the optical member 1 is thought to be caused primarily by shear stress produced in the {100} plane reaching the critical resolved shear stress and causing slippage within the monocrystalline CaF$_2$.

As such, it can be seen from the above-described simulations that in a temperature range of 25° C. to 200° C. the optical member 1 having the lowest value of the maximum shear stress produced in the {100} plane, or in other words, the optical member 1 in which the {110} plane of the monocrystalline CaF$_2$ is orthogonal to the center axis A, has the best strength with respect to the internal pressure (pressure resistance), and the optical member 1 having the next-lowest value of the maximum shear stress produced in the {100} plane, or in other words, the optical member 1 in which the {111} plane of the monocrystalline CaF$_2$ is orthogonal to the center axis A, has the next best strength with respect to the internal pressure.

To be more specific, in the table of FIG. 5, when the optical member 1 in which the {110} plane of the monocrystalline CaF$_2$ is orthogonal to the center axis A has an internal pressure of 30 atm, the maximum shear stress produced in the {100} plane of the monocrystalline CaF$_2$ that forms the optical member 1 is approximately 7.67 MPa in a temperature range of 25° C. to 200° C. Thus as shown in FIG. 6, in the case where an internal pressure of 30 atm is imparted to the optical member 1 in which the {110} plane of the monocrystalline CaF$_2$ is orthogonal to the center axis A, the optical member 1 can be used suitably without being damaged by slippage in the {100} plane at least up to approximately 110° C. If made thicker in the radial direction, the optical member 1 can be used suitably up to even higher temperatures. Furthermore, when the internal pressure is 20 atm, the maximum shear stress produced in the {100} plane of the monocrystalline CaF$_2$ that forms the optical member 1 is approximately 5.11 MPa in a temperature range of 25° C. to 200° C. Thus as shown in FIG. 6, in the case where an internal pressure of 20 atm is imparted to the optical member 1 in which the {110} plane of the monocrystalline CaF$_2$ is orthogonal to the center axis A., the optical member 1 can be used suitably without being damaged by slippage in the {100} plane at least up to approximately 160° C. If made thicker in the radial direction, the optical member 1 can be used suitably up to even higher temperatures. Furthermore, when the internal pressure is 10 atm, the maximum shear stress produced in the {100} plane of the monocrystalline CaF$_2$ that forms the optical member 1 is approximately 2.56 MPa in a temperature range of 25° C. to 200° C. Thus as shown in FIG. 6, in the case where an internal pressure of 10 atm is imparted to the optical member 1 in which the {110} plane of the monocrystalline CaF$_2$ is orthogonal to the center axis A, the optical member 1 can be used suitably without being damaged by slippage in the {100} plane at least up to a temperature range higher than or equal to 200° C. In particular, the optical member 1 can be used suitably in the entire temperature range of lower than or equal to approximately 250° C. (at which plastic deformation occurs in monocrystalline CaF$_2$). If made thicker in the radial direction, the optical member 1 can be used suitably up to even higher temperatures.

Additionally, in the table of FIG. 5, when the optical member 1 in which the {111} plane of the monocrystalline CaF$_2$ is orthogonal to the center axis A has an internal pressure of 30 atm, the maximum shear stress produced in the {100} plane of the monocrystalline CaF$_2$ that forms the optical member 1 is approximately 7.80 MPa in a temperature range of 25° C. to 200° C. Thus as shown in FIG. 6, in the case where an internal pressure of 30 atm is imparted to the optical member 1 in which the {111} plane of the monocrystalline CaF$_2$ is orthogonal to the center axis A, the optical member 1 can be used suitably without being damaged by slippage in the {100} plane at least up to approximately 110° C. If made thicker in the radial direction, the optical member 1 can be used suitably up to even higher temperatures. Furthermore, when the internal pressure is 20 atm, the maximum shear stress produced in the {100} plane of the monocrystalline CaF$_2$ that forms the optical member 1 is approximately 5.20 MPa in a temperature range of 25° C. to 200° C. Thus as shown in FIG. 6, in the case where an internal pressure of 20 atm is imparted to the optical member 1 in which the {111} plane of the monocrystalline CaF$_2$ is orthogonal to the center axis A, the optical member 1 can be used suitably without being damaged by slippage in the {100} plane at least up to approximately 160°C. If made thicker in the radial direction, the optical member 1 can be used suitably up to even higher temperatures. Furthermore, when the internal pressure is 10 atm, the maximum shear stress produced in the {100} plane of the monocrystalline CaF$_2$ that forms the optical member 1 is approximately 2.60 MPa in a temperature range of 25° C. to 200° C. Thus as shown in FIG. 6, in the case where an internal pressure of 10 atm is imparted to the optical member 1 in which the {111} plane of the monocrystalline CaF$_2$ is orthogonal to the center axis A, the optical member 1 can be used suitably without being damaged by slippage in the {100} plane at least up to a temperature range of higher than or equal to 200° C. In particular, the optical member 1 can be used suitably in the entire temperature range of lower than or equal to approximately 250° C. (at which plastic deformation occurs in monocrystalline CaF$_2$). If made thicker in the radial direction, the optical member 1 can be used suitably up to even higher temperatures.

On the other hand, in he table of FIG. 5, when the optical member 1 in which the {100} plane of the monocrystalline CaF$_2$ is orthogonal to the center axis A has an internal pressure of 30 atm, the maximum shear stress produced in the {100} plane of the monocrystalline CaF$_2$ that forms the optical member 1 is approximately 9.21 MPa in a temperature range of 25° C. to 200° C.. Thus as shown in FIG. 6, in the case where an internal pressure of 30 atm is imparted to the optical member 1 in which the {100} plane of the monocrystalline $_2$ is orthogonal to the center axis A, the optical member 1 can be used suitably without being damaged by slippage in the {100} plane at least up to approximately 70°C. However, this temperature is low compared to the temperature (the above-described 110° C.) at which the optical member 1 in which the {110} plane or the {111} plane of the monocrystalline CaF $_2$ is orthogonal to the center axis A can be used safely at the same internal pressure. Furthermore, when the internal pressure is 20 atm, the maximum shear stress produced in the {100} plane of the monocrystalline CaF$_2$ that forms the optical member 1 is approximately 6.14 MPa in a temperature range of 25°)C to 200° C. Thus as shown in FIG. 6, in the case where an internal pressure of 20 atm is imparted to the optical member 1 in which the {100} plane of the monocrystalline CaF$_2$ is orthogonal to the center axis A, the optical member 1 can be used suitably without being damaged by slippage in the {100} plane at least up to approximately 120° C. However, this temperature too is low compared to the temperature (the above-described approximately 160° C.) at which the optical member 1 in which the {110} plane or the {111} plane of the monocrystalline CaF$_2$ is orthogonal to the center axis A can be used safely at the same internal pressure. Furthermore, when the internal pressure is 10 atm, the maximum shear stress produced in the {100} plane of the monocrystalline CaF$_2$ that forms the optical member 1 is approximately 3.07 MPa in a temperature range of 25° C. to 200° C. Thus as shown in FIG. 6, in the case where an internal pressure of 10 atm is imparted to the optical member 1 in which the {100} plane of the monocrystalline CaF$_2$ is orthogonal to the center axis A, the optical member 1 can be used suitably without being damaged by slippage in the {100} plane at least up to approximately 200° C. However, this temperature range too is narrow compared to the temperature range (the entire temperature range of less than or equal to approximately 250° C., as described above) in which the optical member 1 in which the {110} plane or the {111} plane of the monocrystalline CaF$_2$ is orthogonal to the center axis A can be used safely at the same internal pressure.

Based on the above, the strength of the optical member 1 with respect to the internal pressure is greater in the case where the {110} plane or the {111} plane of the monocrystalline CaF$_2$ is orthogonal to the center axis A in the optical member 1. Accordingly, it is preferable that the {110} plane or the {111} plane of the monocrystalline CaF$_2$ be arranged in a direction orthogonal to the center axis A, and further preferable that the {110} plane be arranged in a direction orthogonal to the center axis A, in the optical member 1. This ensures that the optical member 1 can be used at high temperatures and under high pressures.

Next, a method of manufacturing the optical member 1 according to the present embodiment will be described. The monocrystalline CaF$_2$ serving as the material of the optical member 1 can be manufactured using the monocrystal manufacturing method disclosed in Japanese Patent No 4569872, Japanese Unexamined Patent Application Publication No. 2006-327837, and the like, for example. The crystal orientation of the monocrystalline CaF$_2$ ingot thus obtained is measured using an X-ray crystal orientation measurement device or the like.

After the direction in which the {110} plane or the {111} plane of the monocrystalline CaF$_2$ ingot extends has been identified through the above-described measurement, a machining process is carried out so that the identified direction is orthogonal to a center axis A, which creates a cylinder such as that illustrated in FIG. 1. In the cylinder machining process, the monocrystalline CaF$_2$ ingot may be machined directly into a cylindrical shape, or the monocrystalline CaF$_2$ ingot may first be machined into a square column before being machined into a cylinder, The optical member 1 according to the present embodiment can be obtained by lastly subjecting an inner circumferential surface, an outer circumferential surface, and end surfaces of the cylinder obtained from the machining process to an optical polishing process. Any conventional polishing method employed for optical components can be used as-is for optical polishing process of the present embodiment. For example, the machined cylinder can be polished by using an abrasive pad or an abrasive sand.

Effects of present embodiment will be summarized below.

In the optical member 1 according to the present embodiment, the crystal planes of the monocrystalline CaF$_2$ are arranged so as to reduce resolved shear stress produced in the {100} plane when an internal pressure is produced within the optical member 1, or in other words, resolved shear stress which may cause slippage in the monocrystalline CaF$_2$. Thus according to the optical member 1 of the present embodiment, a high-temperature and high-pressure gas can be sealed within the optical member 1 without damaging the optical member 1, which makes it possible to improve plasma emission efficiency, add more options for gases to be used in the plasma emission, and so on.

Additionally, according to the optical member 1 of the present embodiment, the strength of the cylindrical monocrystalline CaF$_2$ member with respect to the internal pressure is increased simply by appropriately setting the arrangement of the crystal planes of the monocrystalline CaF$_2$, without adding any additional members or structures to the cylindrical monocrystalline CaF $_2$ member. Thus the optical member 1 according to the present embodiment can be used in high-temperature and high-pressure environments while keeping a simple shape, and light generated within the optical member 1 can be emitted to the outside efficiently, without any vignetting.

Embodiment 2

Next, Embodiment 2 of the present disclosure will be described with reference to FIG. 7.

Figure 7:
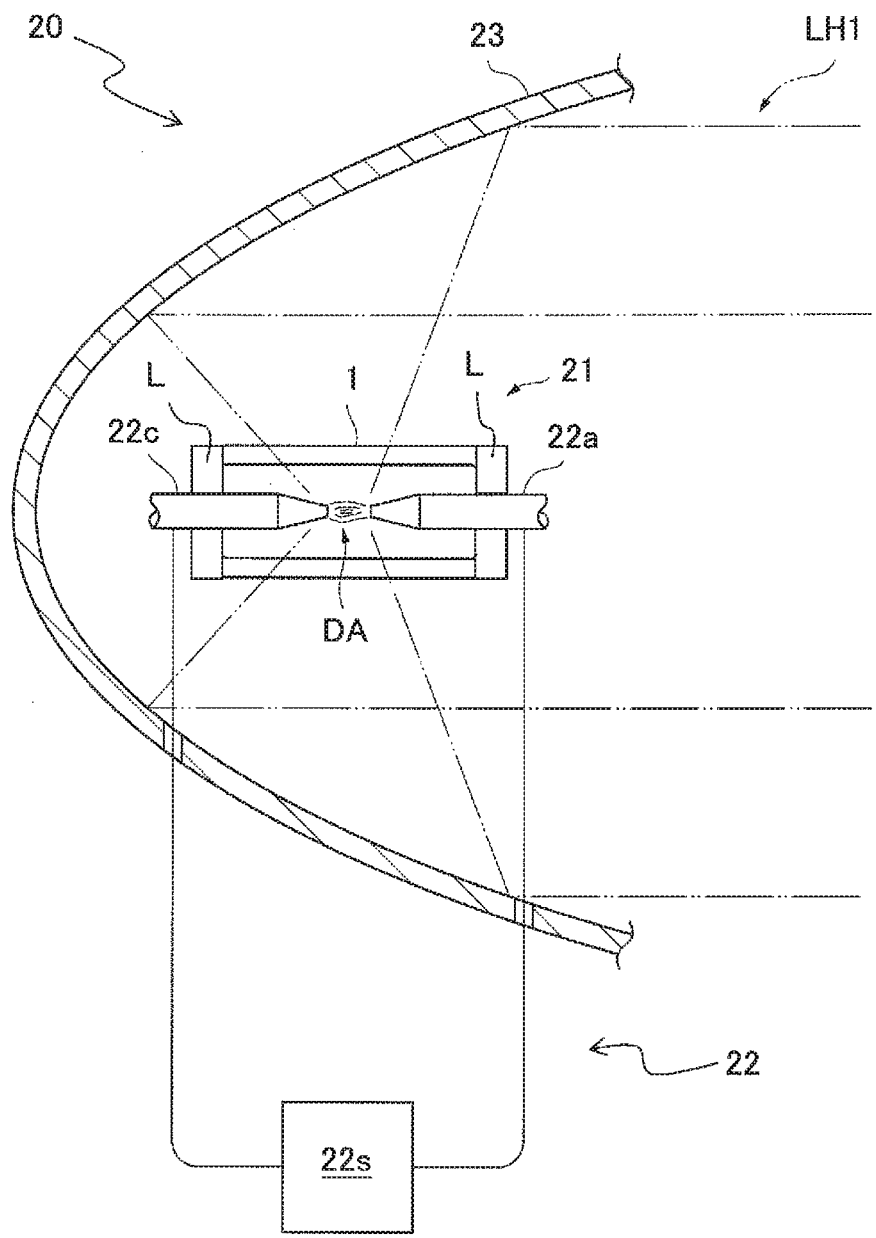
FIG. 7 is a schematic diagram illustrating a light source device according to the embodiment of the present disclosure.

As illustrated in FIG. 7, alight source device 20 according to Embodiment 2 mainly includes a chamber 21, an ignition source 22, and a condensing member 23. The chamber 21 is a gas-holding container obtained by attaching covers L to both end portions of the cylindrical optical member 1 according to the Embodiment 1 in the direction of the center axis A of the optical member 1. The chamber 21 holds a gas (an ionic medium) therein. The cover L is an example of a sealing member, and a metal, an alloy, or the like can be used for the cover L. The sealing member may include an airtight seal member provided between the covers L and the optical member 1. A softened metal or alloy can be used as the airtight seal member, and the covers L may be bonded to the optical member 1 with the airtight seal member. Alternatively, the configuration may be such that seal rings made from a fluoro rubber (FKM) are interposed between the optical member 1 and the covers L as the airtight seal member, and the covers L hold the end surfaces of the optical member 1 by pressurizing the covers L at both end portions of the optical member 1 in the axial direction of the optical member 1. Alternatively, ceramic may be interposed between the covers L and the optical member as the airtight seal member.

The ignition source 22 includes an anode 22a, a cathode 22c, and a power source 22s connected to these two electrodes. The anode 22a is fixed to one of the covers L located at both end portions of the chamber 21 so as to pass through the center of that cover L, and a tip portion of the anode 22a is positioned within the chamber 21. Likewise, the cathode 22c is fixed to the other of the covers L of the chamber 21 so as to pass through the center of that cover L, and a tip portion of the cathode 22c is positioned within the chamber 21. The tip portion of the anode 22a and the tip portion of the cathode 22c thus face each other across a gap within the chamber 21.

The ignition source 22 uses the power source 22s to generate a potential difference between the anode 22a and the cathode 22c, which produces an electrical discharge in the gap between the anode 22a and the cathode 22c. The gap between the anode 22a and the cathode 22c where the electrical discharge is triggered by the ignition source 22 will be called a discharge area DA in the following descriptions. A noble metal, an alloy containing a noble metal, nickel, or the like can be used as the material of the electrodes.

When the light source device 20 is in use, the ignition source 22 produces an electrical discharge in the discharge area DA, which excites the ionic medium held in the chamber 21. The ionic medium that has reached a plasma state emits light, and plasma light LH1 is radiated as a result. The radiated plasma light LH1 traverses the optical member 1 of the chamber 21 and is then reflected by the condensing member 23 (a parabolic mirror, for example) toward a target such as an inspection apparatus (a wafer inspection system, for example), or an exposure device, or the like.

Note that the discharge area DA may be irradiated with an excitation laser using a laser source (not illustrated). In this case, for example, an electrical discharge is triggered in the discharge area DA by the ignition source 22 so as to produce plasma emission from the ionic medium in the discharge area DA that has reached a plasma state. The laser source then supplies laser energy to the ionic medium in the discharge area DA so as to maintain or produce high-luminosity plasma light LH1 from the discharge area DA. The structure described in Embodiment 3, which will be described later, can be given as an example of a structure for supplying the laser energy to the discharge area DA using the laser source.

The light source device 20 according to Embodiment 2 uses the optical member 1 according to Embodiment 1 as part of the chamber 21. Thus as in Embodiment 1, plasma emission efficiency can be improved, more options for gases to be used in the plasma emission can be added, and so on.

Additionally, the plasma light LH1 generated in the chamber 21 can be emitted to the outside of the chamber 21 efficiently, without any vignetting.

Embodiment 3

Embodiment 3 of the present disclosure will be described with reference to FIG. 8.

Figure 8:
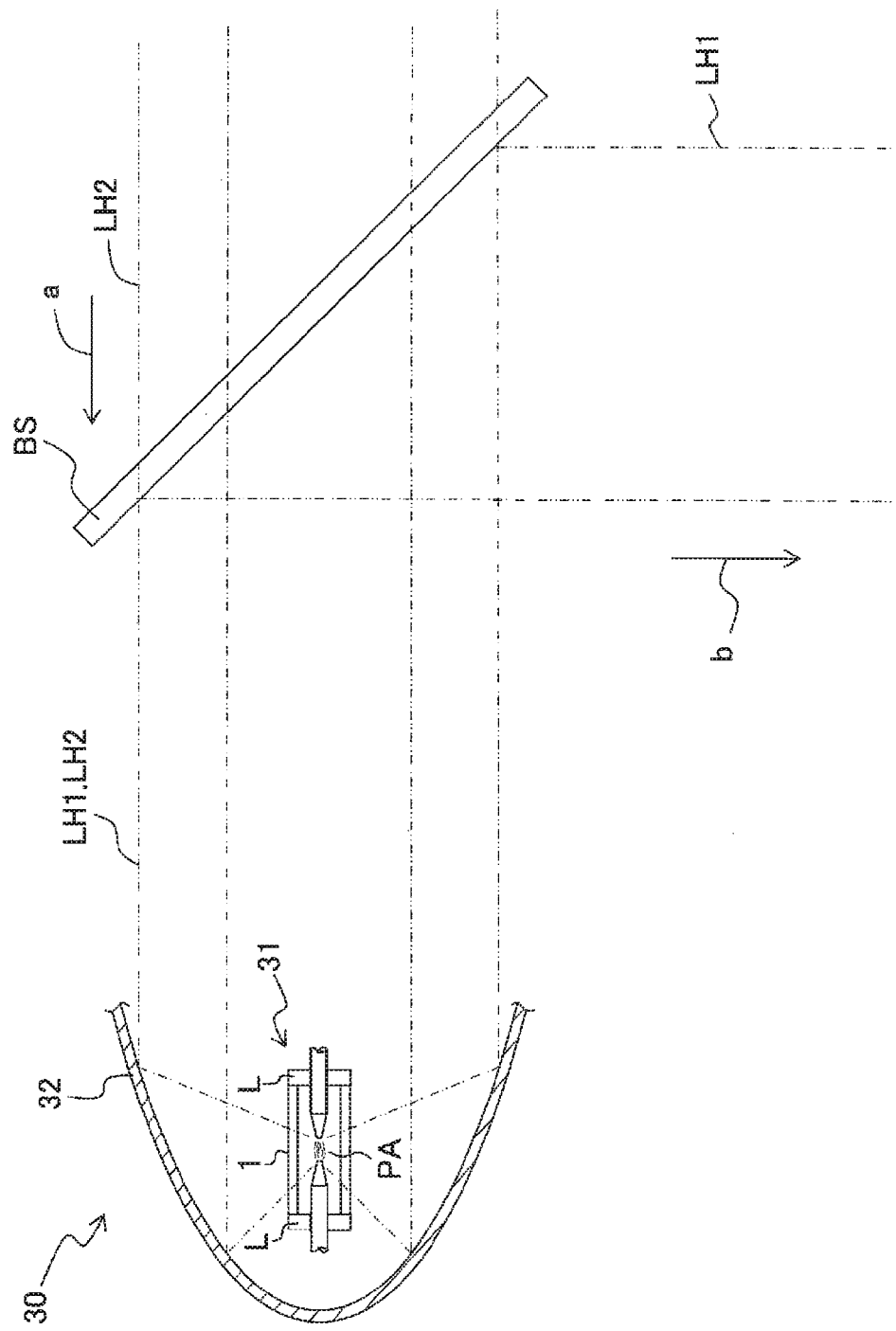
FIG. 8 is a schematic diagram illustrating a light source device according to another embodiment of the present disclosure.

As illustrated in FIG. 8, a light source device 30 according to Embodiment 3 mainly includes a chamber 31 and a condensing member 32. The chamber 31 is a gas-holding container obtained by attaching covers L to both end portions of the cylindrical optical member 1 according to the Embodiment 1 in the direction of the center axis A of the optical member 1. The chamber 31 holds a gas (an ionic medium) therein. The condensing member 32 is a parabolic mirror, for example.

When the light source device 30 is in use, excitation light LH2 supplied by a laser source (not illustrated) in the direction of an arrow a (FIG. 8) is applied to an ionic medium in the chamber 31 via a beam splitter BS and the condensing member 32. The ionic medium, which has been supplied with energy from the emitted excitation light LH2, reaches a plasma state, and high-luminosity plasma light LH1 is generated as a result. The generated plasma light LH1 traverses the optical member 1 of the chamber 31, is reflected by the condensing member 32 and the beam splitter BS, and proceeds in the direction indicated by an arrow b (FIG. 8) so as to be supplied to a target such as an inspection apparatus (a wafer inspection system, for example), an exposure device, or the like. Note that the area in the chamber 31 where the ionic medium reaches a plasma state will be called a plasma area PA hereinafter.

In the light source device 30 according to the present embodiment, the plasma light LH1 is generated by condensing the excitation light LH2 using the condensing member 32 and forming the plasma area PA in a small area in the chamber 21. Thus high-luminosity plasma light LH1 can be generated. Note that even higher-luminosity plasma light MI can be generated by adjusting the shape and the like of the condensing member 32 to make the plasma area PA smaller.

The light source device 30 according to Embodiment 3 uses the optical member 1 according to Embodiment 1 as part of the chamber 31. Thus as in Embodiment 1, plasma emission efficiency can be improved, more options for gases to be used in the plasma emission can be added, and the like. Additionally, the excitation light LH2 can be efficiently supplied to the plasma area PA in the chamber 31, and at the same time, the plasma light LH1 generated in the chamber 31 can be emitted to the outside of the chamber 31 efficiently, without any vignetting.

Although the optical member 1 is cylindrical in the above-described embodiments, the shape of the optical member 1 is not limited to such a shape. Any shape can be employed as long as the member is tubular. For example, the optical member 1 may be a tube of which cross-section orthogonal to the center axis A is elliptical, oblong, or a substantially circular shape in which a portion of a circle is protruded or recessed. Other desired cross-sectional shapes can be employed as well. Moreover, the cylinder and tube are not limited to having a constant thickness in the radial direction. The radial direction thickness of one part may be greater than the radial direction thickness of other parts.

In the above-described Embodiment 2 and Embodiment 3, the gas is sealed by the covers L attached to the openings 1a at the end surfaces 1e on both sides of the optical member 1 in the direction of the center axis A of the optical member 1, and the optical member 1 is used alone as a light source member. However, the usage of the optical member 1 is not limited thereto. For example, the optical member 1 may be used as part of a larger optical member obtained by bonding the optical member 1 to another monocrystalline $CaF_2$ member through pressure bonding or the like. The larger optical member thus obtained can, for example, be an optical member including two optical members 1 sharing the same center axis A, and a spherical shell that is interposed between the two optical members 1 in the direction of the center axis A and that has a rotation axis coaxial with the center axis A. Furthermore, for example, the optical member can be an optical member in which a disk-shaped cap is pressure-bonded to one end of the optical member 1 and an annular flange portion is pressure-bonded to the other end.

In the optical member 1 according to the above-described embodiments, the {110} plane or {111} plane of the monocrystalline $CaF_2$ is arranged in a direction intersecting with the center axis A at an angle of 90°±5°. However, it is more desirable that the {110} plane or the {111} plane of the monocrystalline $CaF_2$ be arranged in a direction intersecting with the center axis A at an angle of 90°±3°, and even more desirable that the {110} plane or the {111} plane of the monocrystalline $CaF_2$ be arranged in a direction intersecting with the center axis A at an angle of 90°.

The chamber 21 according to Embodiment 2 and the chamber 31 according to Embodiment 3 can also be used as gas-holding containers. The gas-holding container may be used with an object to be inspected or measured is held in a gas and sealed within the gas-holding container.

In the above-described embodiments, the gas (ionic medium) is not limited to a gas for emitting plasma light and may be any type of gas for emitting light of wavelengths ranging from the vacuum ultraviolet region to the infrared region, such as excimer light.

According to the above embodiments, a monocrystalline $CaF_2$ optical member having sufficient strength even in high-temperature and high-pressure environments, and a method for manufacturing the monocrystalline $CaF_2$ optical member, are provided.

Provided that the features of the present invention are ensured, the present invention is not limited to the embodiments described above, and other embodiments that embody the technical concepts of the present invention are also included within the scope of the present invention.

The invention claimed is:

1. A calcium fluoride optical member formed from monocrystalline calcium fluoride and having a tubular shape,
   wherein a {110} crystal plane or a {111} crystal plane of the monocrystalline calcium fluoride is orthogonal to a center axis of the tube.

2. The calcium fluoride optical member according to claim 1, wherein the tubular shape is a cylindrical shape.

3. The calcium fluoride optical member according to claim 1, wherein the {110} crystal plane of the monocrystalline calcium fluoride is orthogonal to the center axis of the tube.

4. The calcium fluoride optical member according to claim 1, wherein the calcium fluoride optical member is a gas-sealing container configured to seal a gas therein.

5. The calcium fluoride optical member according to claim 1, wherein the calcium fluoride optical member is used as a light source member.

6. A gas-holding container comprising:
   the calcium fluoride optical member according to claim 1; and
   a sealing member that connects to the tubular calcium fluoride optical member to form a closed space within the tubular calcium fluoride optical member.

7. A light source device comprising:
   the calcium fluoride optical member according to claim 1;
   a sealing member that connects to the tubular calcium fluoride optical member to form a closed space within the tubular calcium fluoride optical member; and
   a gas excitation portion that imparts energy to a gas held in the closed space so as to excite the gas.

8. The light source device according to claim 7, wherein the gas excitation portion is a condensing portion that condenses excitation light inside the calcium fluoride optical member.

9. The light source device according to claim 7, wherein the gas excitation portion includes an electrode provided in the closed space within the calcium fluoride optical member.

10. A calcium fluoride member formed from monocrystalline calcium fluoride and having a tubular shape,
    wherein an angle at which one of a {110} crystal plane and a {111} crystal plane of the monocrystalline calcium fluoride intersects with a direction in which the tube extends is in a range of 90°±5°.

11. The calcium fluoride member according to claim 8, wherein the angle at which the one of the {110} crystal plane and the {111} crystal plane of the monocrystalline calcium fluoride intersects with the direction in which the tube extends is 90°.

12. The calcium fluoride member according to claim 10, wherein the direction in which the tubular calcium fluoride member extends is a direction of a center axis of the tube.

13. The calcium fluoride member according to claim 10, wherein the calcium fluoride member is a gas-sealing container configured to seal a gas therein.

14. The calcium fluoride member according to claim 10, wherein the tubular shape is a cylindrical shape.

15. The calcium fluoride member according to claim 10, wherein the angle at which the {110} crystal plane of the monocrystalline calcium fluoride intersects with the direction in which the tube extends is 90°.

16. A gas-holding container comprising:
    the calcium fluoride member according to claim 10; and
    a sealing member that connects to the tubular calcium fluoride member to form a closed space within the tubular calcium fluoride member.

17. A light source device comprising:
    the calcium fluoride member according to claim 10;
    a sealing member that connects to the tubular calcium fluoride member to form a closed space within the tubular calcium fluoride member; and
    a gas excitation portion that imparts energy to a gas held in the closed space so as to excite the gas.

18. The light source device according to claim 17, wherein the gas excitation portion is a condensing portion that condenses excitation light inside the calcium fluoride member.

19. The light source device according to claim 17, wherein the gas excitation portion includes an electrode provided in the closed space within the calcium fluoride member.

20. A calcium fluoride member formed from monocrystalline calcium fluoride and having a tubular shape,
    wherein a {110} crystal plane or a {111} crystal plane of the monocrystalline calcium fluoride and a direction in which the tube extends intersect at an angle of approximately 90°.

21. A gas-holding container comprising:
the calcium fluoride member according to claim 20; and
a sealing member that connects to the tubular calcium fluoride member to form a closed space within the tubular calcium fluoride member.

22. A light source device comprising:
the calcium fluoride member according to claim 20;
a sealing member that connects to the tubular calcium fluoride member to form a closed space within the tubular calcium fluoride member; and
a gas excitation portion that imparts energy to a gas held in the closed space so as to excite the gas.

23. The light source device according to claim 22, wherein the gas excitation portion is a condensing portion that condenses excitation light inside the calcium fluoride member.

24. The light source device according to claim 22, wherein the gas excitation portion includes an electrode provided in the closed space within the calcium fluoride member.

25. A manufacturing method of a calcium fluoride optical member, the method comprising:
specifying a direction of a {110} crystal lane or a {111} crystal plane of monocrystalline calcium fluoride; and
machining the monociystalline calcium fluoride into a tubular shape,
wherein the machining is carried out an that a center axis of the tube and the specified direction of the {110} crystal plane or the {111} crystal plane are orthogonal to each other.

26. The manufacturing method according to claim 25, wherein the tubular shape is a cylindrical shape.

* * * * *

UNITED STATES PATENT AND TRADEMARK OFFICE
CERTIFICATE OF CORRECTION

PATENT NO.      : 9,613,791 B2  
APPLICATION NO. : 15/245716  
DATED           : April 4, 2017  
INVENTOR(S)     : Naoyasu Uehara et al.

Page 1 of 1

It is certified that error appears in the above-identified patent and that said Letters Patent is hereby corrected as shown below:

In the Claims

Column 17, Line 23 (Claim 25), delete "lane" and insert --plane--, therefor.

Column 17, Line 25 (Claim 25), delete "monociystalline" and insert --monocrystalline--, therefor.

Column 17, Line 27 (Claim 25), delete "an" and insert --so--, therefor.

Signed and Sealed this  
Twentieth Day of June, 2017

Joseph Matal  
*Performing the Functions and Duties of the  
Under Secretary of Commerce for Intellectual Property and  
Director of the United States Patent and Trademark Office*